United States Patent
Wagner et al.

(10) Patent No.: US 9,516,732 B2
(45) Date of Patent: Dec. 6, 2016

(54) RADIATION SOURCE

(75) Inventors: Christian Wagner, Duizel (NL); Erik Roelof Loopstra, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 244 days.

(21) Appl. No.: 14/241,986

(22) PCT Filed: Jul. 27, 2012

(86) PCT No.: PCT/EP2012/064775
§ 371 (c)(1),
(2), (4) Date: Feb. 28, 2014

(87) PCT Pub. No.: WO2013/029895
PCT Pub. Date: Mar. 7, 2013

(65) Prior Publication Data
US 2014/0211184 A1  Jul. 31, 2014

Related U.S. Application Data

(60) Provisional application No. 61/530,782, filed on Sep. 2, 2011.

(51) Int. Cl.
*H05G 2/00* (2006.01)
*G03F 7/20* (2006.01)
(Continued)

(52) U.S. Cl.
CPC .......... *H05G 2/008* (2013.01); *G03F 7/70025* (2013.01); *G03F 7/70033* (2013.01);
(Continued)

(58) Field of Classification Search
CPC .......... G03F 7/70008; G03F 7/70025; G03F 7/70033; G03F 7/70041; G02B 27/283; H01S 1/00; H01S 3/0071; H01S 3/081; H01S 3/2333; H01S 3/2316; H01S 3/0064; H05G 2/005; H05G 2/008
See application file for complete search history.

(56) References Cited

U.S. PATENT DOCUMENTS

| 4,194,813 A | 3/1980 | Benjamin et al. |
| 5,790,574 A * | 8/1998 | Rieger .................. H01S 3/115 372/12 |

(Continued)

FOREIGN PATENT DOCUMENTS

| JP | 2006-172898 A | 6/2006 |
| JP | 2006-228998 A | 8/2006 |
| WO | WO 2011/102277 A1 | 8/2011 |

OTHER PUBLICATIONS

International Search Report directed to related International Patent Application No. PCT/EP2012/064775, mailed Dec. 7, 2012; 5 pages.

(Continued)

*Primary Examiner* — Toan Ton
*Assistant Examiner* — Michelle M Iacoletti
(74) *Attorney, Agent, or Firm* — Sterne, Kessler, Goldstein & Fox P.L.L.C.

(57) ABSTRACT

According to a first aspect of the present invention, there is provided a radiation source comprising: a nozzle configured to direct a stream of fuel droplets (70) along a trajectory towards a plasma formation location; a laser configured to direct laser radiation at a fuel droplet at the plasma formation location to generate, in use, a radiation generating plasma; wherein the laser comprises: a seed laser (50) for providing a seed laser beam (52); a beam splitter (54) for receiving the seed laser beam from the seed laser; an optical amplifier (58) for receiving the seed laser beam from the beam splitter and performing optical amplification; a first reflector (60) located downstream of the optical amplifier, configured to direct the seed laser beam back through the optical amplifier and on to the beam splitter; and a second reflector (70) located further downstream of the beam splitter, configured to receive the seed laser beam from the beam splitter and to direct at least a portion of the seed laser beam back toward the beam splitter.

9 Claims, 3 Drawing Sheets

(51) Int. Cl.
*H01S 3/23* (2006.01)
*H01S 3/00* (2006.01)
*G02B 27/28* (2006.01)

(52) U.S. Cl.
CPC ........... *H01S3/2316* (2013.01); *H01S 3/2333* (2013.01); *H05G 2/003* (2013.01); *H05G 2/005* (2013.01); *G02B 27/283* (2013.01); *G03F 7/70983* (2013.01); *H01S 3/0064* (2013.01)

(56) References Cited

U.S. PATENT DOCUMENTS

| | | |
|---|---|---|
| 2002/0018288 A1 | 2/2002 | Rieger et al. |
| 2005/0205811 A1 | 9/2005 | Partlo et al. |
| 2006/0039435 A1 | 2/2006 | Cheymol et al. |
| 2006/0140227 A1 | 6/2006 | Rocca et al. |
| 2007/0001130 A1* | 1/2007 | Bykanov et al. ......... 250/493.1 |
| 2007/0007469 A1 | 1/2007 | Murakami et al. |
| 2008/0030846 A1 | 2/2008 | Starodoumov et al. |
| 2008/0087847 A1 | 4/2008 | Bykanov et al. |
| 2008/0165337 A1 | 7/2008 | Ershov et al. |
| 2008/0181266 A1 | 7/2008 | Deladurantaye et al. |
| 2009/0219959 A1 | 9/2009 | Murison et al. |
| 2011/0122483 A1 | 5/2011 | Lundquist et al. |
| 2011/0242515 A1* | 10/2011 | Ceglio ................. G02B 5/0891 355/67 |
| 2012/0243566 A1 | 9/2012 | Hori et al. |

OTHER PUBLICATIONS

International Preliminary Report on Patentability and Written Opinion of the International Searching Authority, directed to related International Patent Application No. PCT/EP2012/064775, mailed Mar. 4, 2014; 9 pages.

Hassanein, A., et al., "Combined effects of prepulsing and target geometry on efficient extreme ultraviolet production from laser produced plasma experiments and modeling," Journal of Micro/Nanolithography, MEMS, and MOEMS, vol. 10, No. 3, Jul.-Sep. 2011; pp. 033002-1 to 033002-6.

Pearlman, J.S., et al., "Angular Dependence of Polarization-Related Laser-Plasma Absorption Processes," Physical Review Letters, vol. 39, No. 3, Jul. 18, 1977; pp. 140-142.

Rettig, C.L., et al., "Efficiency and scaling of an ultrashort-pulse high-repetition-rate laser-driven X-ray source," Applied Physics B, vol. 93, 2008; pp. 365-372.

Teubner, U., et al., "Soft-x-ray radiation from plasmas produced by obliquely incident subpicosecond laser pulses," Physical Review E, vol. 50, No. 5, Nov. 1994; pp. R3334-R3337.

Zhang, J., et al., "Studies of Interactions of Femtosecond Laser Pulses with Foil Targets," Journal of Korean Physical Society, vol. 39, No. 5, Nov. 2001; pp. 825-830.

* cited by examiner

RADIATION SOURCE

CROSS-REFERENCE TO RELATED APPLICATIONS

This application claims the benefit of U.S. provisional application 61/530,782 which was filed on 2 Sep. 2011 and which is incorporated herein in its entirety by reference.

FIELD

The present invention relates to a radiation source, suitable for use in conjunction with, or forming part of, a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

A proposed EUV LPP radiation source comprises a seed laser. The seed laser directs a seed laser beam in to and through one or more optical amplifiers (e.g., a high gain or pre-amplifier, followed by one or more power amplifiers). The amplified laser radiation is then directed toward and is incident on a fuel droplet. The amplified laser radiation is used to, for example, at least partially vaporise the fuel droplet to generate EUV radiation. However, when the amplified laser radiation is incident upon the fuel droplet, a portion of the amplified laser radiation might reflect off the fuel droplet and back along the same initial beam path towards the seed laser. This return beam may be amplified by the optical amplifiers on its way back to the seed laser, which could result in an amplified laser beam being incident on the seed laser itself. This can cause damage to the seed laser.

SUMMARY

It is desirable to obviate or mitigate at least one problem of the prior art, whether identified herein or elsewhere, or to provide an alternative to existing apparatus or methods.

According to a first aspect of the present invention, there is provided a radiation source comprising: a nozzle configured to direct a stream of fuel droplets along a trajectory towards a plasma formation location; a laser configured to direct laser radiation at a fuel droplet at the plasma formation location to generate, in use, a radiation generating plasma; wherein the laser comprises: a seed laser for providing a seed laser beam; a beam splitter for receiving the seed laser beam from the seed laser; an optical amplifier for receiving the seed laser beam from the beam splitter and performing optical amplification; a first reflector located downstream of the optical amplifier, configured to direct the seed laser beam back through the optical amplifier and on to the beam splitter; and a second reflector located further downstream of the beam splitter, configured to receive the seed laser beam from the beam splitter and to direct at least a portion of the seed laser beam back toward the beam splitter.

The beam splitter may be a polarizing or polarized beam splitter.

A wave plate may be located in a beam path between the beam splitter and the first reflector. The wave plate may be a quarter wave plate. The wave plate might be configured to ensure that a polarization state of radiation is changed (i.e., rotated) by 90° after passing through the wave plate twice.

The beam splitter may be arranged to direct only a minor portion of the seed laser beam to the optical amplifier (e.g., 10%). A major portion (e.g., 90%) may be directed elsewhere, for example to a beam dump or the like.

The second reflector may be a fuel droplet.

The optical amplifier may be a high gain amplifier, or a pre-amplifier (or at least the amplifier with the highest gain if more than one amplifier is used in the amplification process).

One or more further optical amplifiers (e.g., with lower gain than the optical amplifier already described) may be located in a beam path and between the beam splitter and the second reflector.

According to a second aspect of the present invention, there is provided a laser comprising: a seed laser for providing a seed laser beam; a beam splitter for receiving the seed laser beam from the seed laser; an optical amplifier for receiving the seed laser beam from the beam splitter and performing optical amplification; a first reflector located downstream of the optical amplifier, configured to direct the seed laser beam back through the optical amplifier and on to the beam splitter; and a second reflector located further downstream of the beam splitter, configured to receive the seed laser beam from the beam splitter and to direct at least a portion of the seed laser beam back toward the beam splitter.

One or more of any amplifiers described herein may be pumped and/or triggered by the seed laser. Alternatively or additionally, one or more amplifiers may be pumped in to an excited (or amplification) state by one or more other schemes, for example by use of electrical input or the like.

According to a third aspect of the present invention, there is provided a lithographic apparatus comprising, being in connection with, or connectable to, a radiation source or laser of another aspect of this invention.

The lithographic apparatus may further comprise an illumination system for providing a radiation beam; a patterning device for imparting the radiation beam with a pattern in its cross-section; a substrate holder for holding a substrate; and a projection system for projecting the patterned radiation beam onto a target portion of the substrate.

According to a fourth aspect of the present invention, there is provided a method of generating laser radiation, the method comprising: directing a seed laser beam toward a beam splitter; the seed laser beam being directed by the beam splitter to an optical amplifier for optical amplification; after the seed laser beam has passed through the optical amplifier, directing the seed laser beam back though the optical amplifier for optical amplification, and then on to the beam splitter; the beam splitter directing the seed laser beam downstream, where at least a portion of the seed laser beam is then directed back toward the beam splitter.

The amplifiers may sometimes be referred to as cavities.

It will be appreciated that one or more features described in relation to one aspect of the invention may, where appropriate, be applicable to any other aspect of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
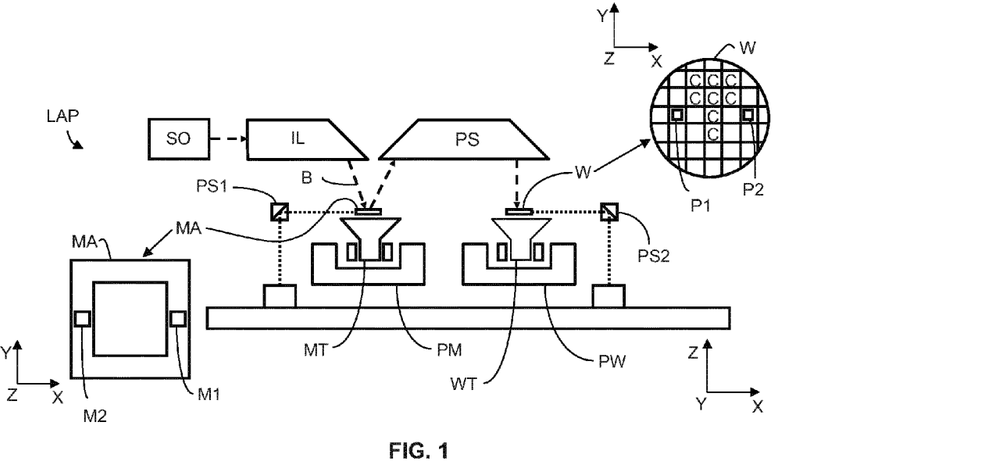
FIG. 1 depicts a lithographic apparatus according to an embodiment of the invention.

FIG. 1 schematically depicts a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted mirrors impart a pattern in a radiation beam that is reflected by the minor matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma (LPP), the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often referred to as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
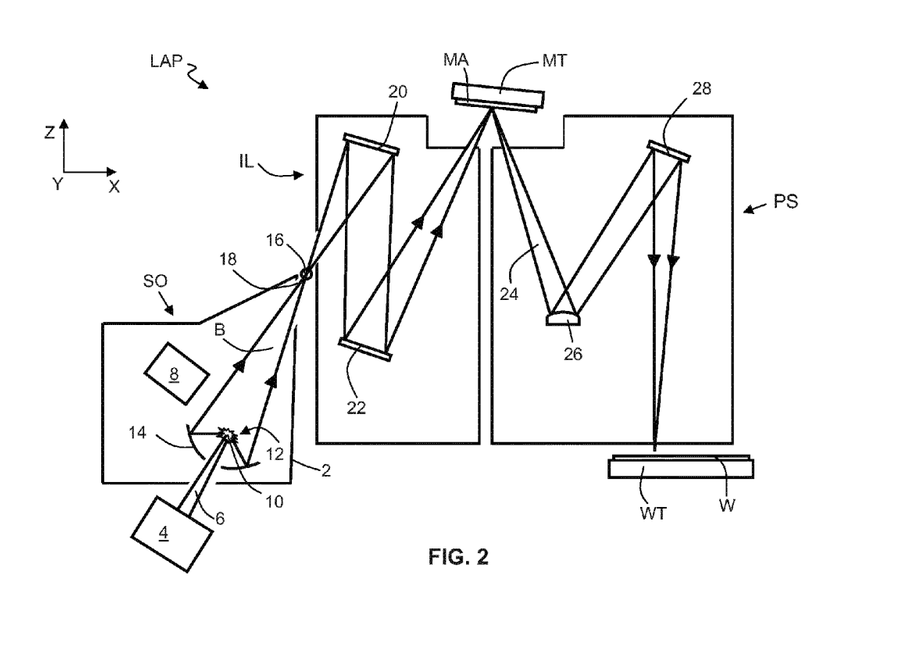
FIG. 2 is a more detailed view of the apparatus of FIG. 1, including an LPP source collector module.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) that is provided from a fuel supply 8. Tin (most likely in the form of droplets) is currently thought to be the most promising and thus likely choice of fuel for EUV radiation sources. The deposition of laser energy into the fuel creates a highly ionized plasma 10 at a plasma formation location 12 that has electron temperatures of several tens of electron-volts (eV). The energetic radiation generated during de-excitation and recombination of these ions is emitted from the plasma 10, collected and focussed by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat the fuel before the laser beam 6 is incident upon it. An LPP source that uses this approach may be referred to as a dual laser pulsing (DLP) source.

Although not shown, the fuel supply will comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

Figure 3:
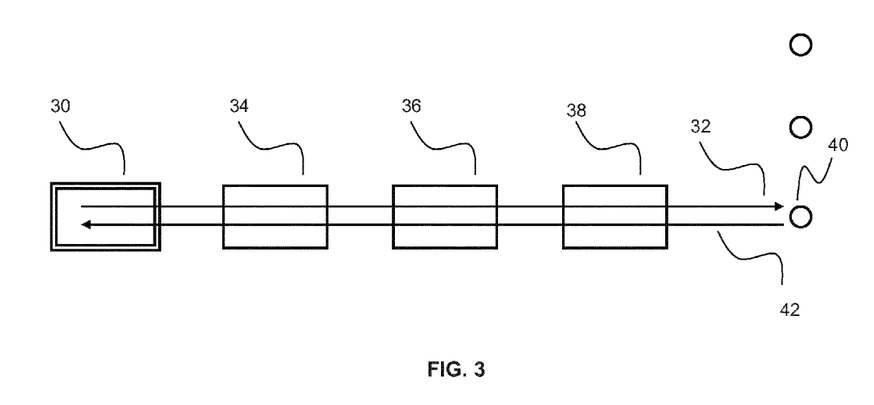
FIG. 3 schematically depicts a laser suitable for use as a part of the radiation source shown in and described with reference to FIGS. 1 and 2.

FIG. 3 schematically depicts a laser suitable for use as part of the radiation source described above (e.g., the laser 4 of FIG. 2). Referring back to FIG. 3, the laser comprises a seed laser 30 for providing a seed laser beam 32. The seed laser beam 32 is directed toward and through one or more optical amplifiers 34, 36, 38 (e.g., a pre-amplifier or high gain amplifier 34 and one or more power amplifiers 36, 38). After passing through the optical amplifiers 34, 36, 38, the amplified seed laser beam 32 is incident on a fuel droplet 40.

At least partial vaporisation of the fuel droplet 40 may take place in order to generate EUV radiation, as described above.

All of the generated laser radiation may not be used to vaporise the fuel droplet 40. Instead, a portion of the laser radiation 42 may be reflected off the droplet 40 and back along substantially the same initial laser beam path, back toward the optical amplifiers 34, 36, 38 and the seed laser 30 itself. When directed in this manner, the reflected and thus returning beam may again be amplified before being incident on the seed laser 30. In particular, significant amplification may take place in the high-gain amplifier or pre-amplifier 34. This is because when the seed laser beam 42 makes a first pass through such an amplifier 34, substantially only the exit portion of the amplifier 34 is emptied of electrons in an excited or elevated state due to the avalanche effect (i.e., only those electrons are returned to a lower or a lowest energy level). This leaves the other—or entry—portion of the amplifier substantially full of such excited or elevated electrons, and thus capable of further amplification when the seed laser beam returns through that amplifier but from the opposite direction. An amplified (seed) laser beam that is incident on the seed laser 30 can cause damage to the seed laser 30. It is desirable to minimise the amplification of any laser beam that is incident on the seed laser, to minimise or avoid any damage to the laser.

The abovementioned problems may be obviated or mitigated according to the present invention. According to the present invention, a laser is provided. The laser comprises a seed laser for providing a seed laser beam. In accordance with the present invention, a beam splitter is provided for receiving the seed laser beam from the seed laser. The beam splitter directs (e.g., by transmission or reflection, where appropriate) the seed laser beam towards an optical amplifier for optical amplification (e.g., a high gain amplifier or pre-amplifier, as described above). A first reflector (e.g., a mirror or a prism or the like) is located downstream of the optical amplifier. After the seed laser beam has passed through the amplifier, the reflector is configured to direct the seed laser beam back through the optical amplifier and onto the beam splitter. By ensuring that the seed laser beam passes through the optical amplifier in two substantially opposite directions, the amplifier is substantially "emptied" of excited or elevated electrons, and thus can provide no further gain or amplification of, for example, a returning beam, as will be described in more detail below. However, and at the same time, the seed laser beam is amplified even more than in the prior art, due to this emptying—the amplification is approximately double, due the emptying of both ends of portions of the amplifier. The seed laser beam is then directed toward and through the beam splitter and on to a second reflector. The second reflector might be a fuel droplet, which may be converted into a radiation generating plasma. The second reflector is configured to receive the seed laser beam from the beam splitter and to direct at least a portion of the seed laser beam (which includes at least a portion thereof) back toward the beam splitter. Even if this return beam passes through the beam splitter, it cannot thereafter be amplified by the optical amplifier referred to above, since this amplifier has been emptied of excited electrons and can provide no further amplification. Such amplification might otherwise result in damage to the seed laser if that beam were to be directed back toward the seed laser itself.

An embodiment of the present invention will now be described, by way of example only, with reference to FIGS. 4 to 6, in which like features have been given the same reference numerals for consistency and clarity. The Figures have not been drawn to any particular scale.

Figure 4:
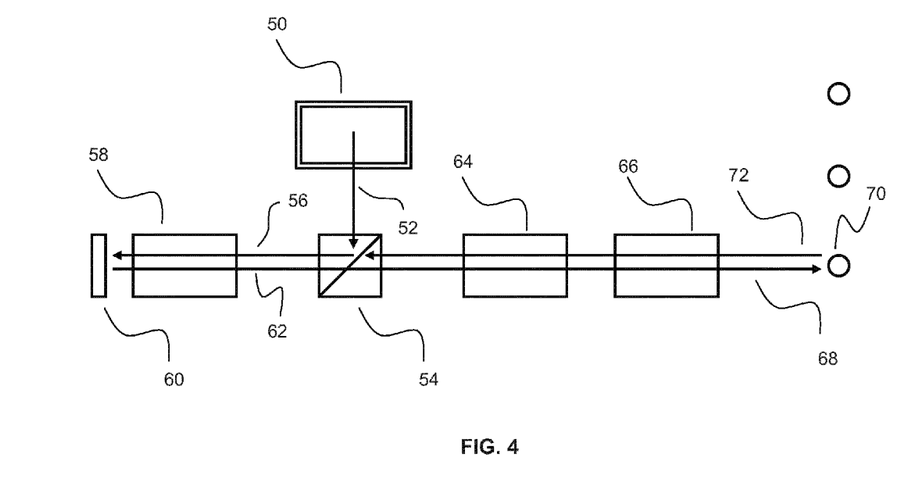
FIG. 4 schematically depicts an overview of a laser according to an embodiment of the present invention, suitable for use as part of the radiation source as shown in and described with reference to FIGS. 1 and 2.

FIG. 4 schematically depicts a laser suitable for use as part of the radiation source described above (e.g., the laser 4 of FIG. 2). Referring back to FIG. 4, the laser comprises a seed laser 50 for providing a seed laser beam 52. A beam splitter 54 is provided for receiving the seed laser beam 52 and for directing at least a portion 56 of the seed laser beam toward a main optical amplifier 58 (e.g., a high gain amplifier or pre-amplifier, as discussed above, or at least the amplifier with the highest gain in the laser). Optical amplification takes place within the optical amplifier 58. A first reflector 60 (e.g., a mirror or prism or the like) is located downstream of the optical amplifier 58. The first reflector 60 is configured to direct the portion of the seed laser beam back through the optical amplifier 58 in substantially the opposite direction to which the portion of the seed laser beam was initially directed. By passing the seed laser beam through the amplifier 58 in these two substantially opposite directions, the optical amplifier can be "emptied" of excited electrons, meaning that further gain or amplification cannot take place within the optical amplifier 58, for example of a return beam (described in more detail below).

After passing through the optical amplifier 58 the seed laser beam 62 continues towards the beam splitter 54. As will be discussed in more detail below, the beam splitter (possibly in combination with one or more additional components) is configured such that little or no amplified radiation is directed back toward the seed laser 50, but is instead passed in a different downstream direction. This direction leads to, for instance, further optical amplifiers 64, 66 (e.g., lower gain power amplifiers) where further amplification may take place, before the amplified laser beam 68 is incident upon a targeted fuel droplet 70. At least partial vaporisation of the fuel droplet 70 may now take place, allowing EUV radiation to be generated and collected for use as a radiation beam in a lithographic apparatus, for example as described above. However, not all of the laser beam radiation 68 is used to at least partially vaporise the fuel droplet 70. Instead, a portion 72 of the laser beam radiation may be directed by reflection or the like back along substantially the same initial beam path, through the amplifiers 64, 66 and toward the beam splitter 54. Depending on how the beam splitter 54 is configured, the return beam may be substantially prevented from passing through the beam splitter 54, or may be configured such that only a portion of the return beam 72 can pass through the beam splitter 54. Even if a portion does pass through the beam splitter 54 and on to and through the high-gain or pre-amplifier 58 and on to, eventually and/or possibly, the seed laser 50 itself, no further amplification can take place therein due to the amplifier 58 being "emptied" of excited electrons in the previously described "double-pass" of the seed beam 56 through that amplifier 58. Thus, damage to the seed laser is obviated or mitigated.

As briefly discussed above, the beam splitter (and possibly other components) may be appropriately configured or provided to ensure that little or no returned radiation (i.e., radiation reflected off a droplet or, in general, second reflector) is passed back to the seed laser 50. In accordance with embodiments of the present invention, this may be achieved in one of two ways, described separately and respectively in FIGS. 5 and 6.

Figure 5:
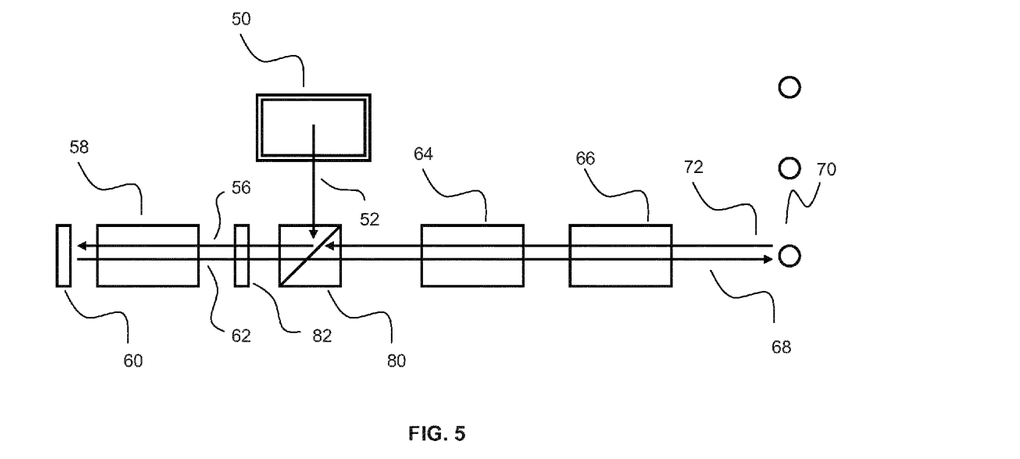
FIG. 5 schematically depicts a laser according to a first embodiment of the present invention.

Referring to FIG. 5, the beam splitter is now specifically a polarising or polarised beam splitter 80 that can either polarise the seed laser beam 52 or at least is capable of reflecting radiation having a first polarisation, and substantially transmitting radiation having a second polarisation direction. Downstream of the beam splitter 80 is provided a wave plate 82, located in the beam path between the beam splitter 80 and the first reflector 60. For instance, the wave plate 82 may be a quarter wave plate.

In use the seed laser beam 52 again is directed toward the beam splitter 80 and toward the amplifier 58 (for amplification) and the first reflector 60. However, in accordance with this embodiment, the seed laser beam 52 (or at least the portion 56 thereof) passes through the wave plate 82, where the polarisation state is changed (for example from linearly polarised to circularly polarised). After being reflected by the first reflector 60, and passing through the amplifier 58, the portion of the seed laser beam again has its polarisation state changed (e.g., from circularly polarised to linearly polarised), but now the linear polarisation has a different orientation to that initially provided by the beam splitter 80 to radiation received from the seed laser 50 (for example by 90°). Having this new, different orientation, the polarisation is such that the seed laser beam passes substantially straight through the beam splitter 80 and, for instance, on to further (and, e.g., lower gain) optical amplifiers 64, 66 before being incident on the fuel droplet 70 for generation of EUV radiation, as discussed above.

Any reflected and thus returning radiation 72 should have the same polarisation state as radiation incident on the droplet 70. This means that the returning radiation 72 may be directed to and through the amplifiers 64, 66, and straight through the beam splitter 80. The direction of polarisation will then be changed again (for example by 90°) after passing twice through the wave plate 82 after reflection off the first reflector 60, before again being incident on the beam splitter 80. Now that the polarisation state has changed (e.g., by 90°) the radiation beam is unable to pass through the beam splitter 80, and is instead reflected by the beam splitter 80 toward the seed laser 50. Any portion of the seed laser beam now being directed back to the seed laser 50 will be small, due to a small amount of reflection off the droplet 70. Furthermore, and as described above, no amplification of the seed laser beam will have taken place in the main amplifier 58 due to that amplifier having already been "emptied" of excited electrons, thus preventing amplification. Thus, damage to the seed laser 50 is obviated or mitigated.

It will be understood that minimal amplification may take place when the return beam portion passes through the further amplifiers 64, 66. However, such amplifiers will have lower gain (in general), and will thus have a minimal effect on amplification. Also, having lower gain, it is more likely that such amplifiers will have been emptied by a single pass through of the seed laser beam, resulting in any amplification of a returning beam being minimal.

Figure 6:
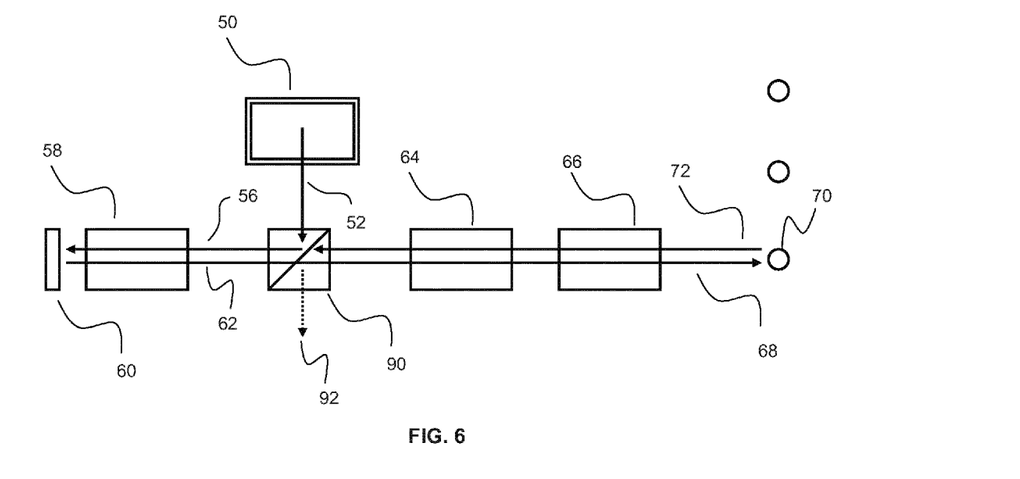
FIG. 6 schematically depicts a laser according to a second embodiment of the present invention.

FIG. 6 schematically depicts an alternative embodiment in which a polarised beam splitter does not need to be used. Instead, in this embodiment a general beam splitter is used, and specifically a beam splitter 90 that is capable of directing only a minor portion 56 of the seed laser beam 52 to the optical amplifier 58 and, for example, allowing a majority of the seed laser beam 92 to pass through the beam splitter (and, for example, on to a beam dump or the like). In this embodiment, one advantage is that no amplification of the return beam 68 is possible within the amplifier 58 due to the amplifier 58 being previously "emptied" of excited electrons, in the manner as described above. Another advantage is that only a minor portion 56 of the seed laser beam is passed back to the beam splitter 90 and that, due to the transmissive properties of the beam splitter 90, only an even smaller portion of this minor portion is directable back toward the seed laser 50. For instance, if the beam splitter 90 transmitted 90% of the initial seed laser beam and only reflected 10% for amplification, then only 10% of any return beam (amplified or otherwise) could ever be passed back to the seed laser 50, thus minimising any damage that could otherwise be caused to the seed laser 50.

It will again be understood that minimal amplification may take place when the return beam portion passes through the further amplifiers 64, 66. However, such amplifiers will have lower gain (in general), and will thus have a minimal effect on amplification. Also, having lower gain, it is more likely that such amplifiers will have been emptied by a single pass through of the seed laser beam, resulting in any amplification of a returning beam being minimal.

In the embodiments described above, the laser has been described in relation to the vaporisation of fuel droplets or the like, one of those fuel droplets forming a second reflector of the laser. In other embodiments, a fuel droplet may not be required for use as a second reflector, and a mirror or prism or the like may be the second reflector.

In the embodiments described above, beams travelling in different directions have been shown as being separated from one another, or offset from one another—this is for clarity purposes only. In reality, the beams will share the same beam path, or substantially the same beam path.

The lasers described herein may be described as master oscillator power amplifier (MOPA) lasers, due to the use of a seed laser to generate a main amplified laser beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

The invention claimed is:

1. A radiation source comprising:
a nozzle configured to direct a stream of fuel droplets along a trajectory towards a plasma formation location; and
a laser system configured to direct a laser beam at a fuel droplet at the plasma formation location to generate, in use, a radiation generating plasma,
wherein the laser system comprises:
a seed laser configured to provide a seed laser beam;
a beam splitter configured to receive the seed laser beam from the seed laser;
an optical pre-amplifier configured to receive the seed laser beam from the beam splitter and provide an amplified seed laser beam;
a first reflector configured to receive the amplified seed laser beam and to direct the amplified seed laser beam to the beam splitter via the optical pre-amplifier to provide twice amplified seed laser beam; and
a further optical amplifier configured to receive the twice amplified seed laser beam via the beam splitter and to further amplify the twice amplified seed laser beam in a single pass through the further optical amplifier to generate the laser beam.

2. The radiation source of claim 1, wherein the beam splitter is a polarizing or polarized beam splitter.

3. The radiation source of claim 1, wherein a wave plate is located in a beam path between the beam splitter and the first reflector.

4. The radiation source of claim 3, wherein the wave plate is a quarter wave plate.

5. The radiation source of claim 1, wherein the beam splitter is arranged to direct approximately 10% of the seed laser beam to the optical pre-amplifier.

6. A laser system for generating a laser beam, comprising:
a seed laser configured to provide a seed laser beam;
a beam splitter configured to receive the seed laser beam from the seed laser;
an optical pre-amplifier configured to receive the seed laser beam from the beam splitter and provide an amplified seed laser beam;
a first reflector configured to receive the amplified seed laser beam and to direct the amplified seed laser beam to the beam splitter via the optical pre-amplifier to provide twice amplified seed laser beam; and
a further optical amplifier configured to receive the twice amplified seed laser beam via the beam splitter and to further amplify the twice amplified seed laser beam in a single pass through the further optical amplifier to generate the laser beam.

7. A method of generating a laser beam radiation, the method comprising:
directing a seed laser beam toward a beam splitter;
directing the seed laser beam using the beam splitter to an optical pre-amplifier to provide an amplified seed laser beam;
after the seed laser beam has passed through the optical pre-amplifier, directing the amplified seed laser beam off a first reflector and to the beam splitter again via the optical pre-amplifier to provide twice amplified seed laser beam; and
further amplifying the twice amplified seed laser beam in a single pass through a further optical amplifier to generate the laser beam.

8. A lithographic apparatus comprising a laser system for generating a laser beam, the laser system comprising:
a seed laser configured to provide a seed laser beam;
a beam splitter configured to receive the seed laser beam from the seed laser;
an optical pre-amplifier configured to receive the seed laser beam from the beam splitter and provide an amplified seed laser beam;

a first reflector configured to receive the amplified seed laser beam and to direct the amplified seed laser beam to the beam splitter via the optical pre-amplifier to provide twice amplified seed laser beam; and a further optical amplifier configured to receive the twice amplified seed laser beam via the beam splitter and to further amplify the twice amplified seed laser beam in a single pass through the further optical amplifier to generate the laser beam.

9. The lithographic apparatus of claim 8, further comprising:

an illumination system for providing a radiation beam;

a patterning device for imparting the radiation beam with a pattern in its cross-section;

a substrate holder for holding a substrate; and a projection system for projecting the patterned radiation beam onto a target portion of the substrate.

* * * * *

UNITED STATES PATENT AND TRADEMARK OFFICE
CERTIFICATE OF CORRECTION

PATENT NO. : 9,516,732 B2
APPLICATION NO. : 14/241986
DATED : December 6, 2016
INVENTOR(S) : Wagner et al.

It is certified that error appears in the above-identified patent and that said Letters Patent is hereby corrected as shown below:

In Claim 7, Column 12, Line 46, please delete "radiation".

Signed and Sealed this
Thirty-first Day of July, 2018

Andrei Iancu
*Director of the United States Patent and Trademark Office*